United States Patent [19]

Comeaux

[11] 4,023,154
[45] May 10, 1977

[54] APPARATUS FOR DETECTING LOCATION OF METAL CABLE FAILURE

[76] Inventor: Willie George Comeaux, 8067 LaSalle, Baton Rouge, La. 70806

[22] Filed: Apr. 9, 1976

[21] Appl. No.: 675,516

[52] U.S. Cl. .............................. 340/256; 324/51; 340/253 R; 361/45
[51] Int. Cl.[2] ...................................... G08B 21/00
[58] Field of Search .......... 340/248, 253, 255, 256; 317/18 C; 324/51, 52

[56] References Cited

UNITED STATES PATENTS

| | | | |
|---|---|---|---|
| 2,783,434 | 2/1957 | Bäbler | 324/52 |
| 2,838,604 | 6/1958 | Hoth | 324/52 X |
| 3,031,643 | 4/1962 | Sheftelman | 324/52 X |
| 3,211,997 | 10/1965 | Hara | 324/52 |
| 3,234,459 | 2/1966 | Brazee | 324/52 |
| 3,343,080 | 9/1967 | Fox | 340/255 X |
| 3,633,196 | 1/1972 | Winkler et al. | 340/256 X |
| 3,723,813 | 3/1973 | Allen | 340/256 X |
| 3,728,582 | 4/1973 | Agnew | 317/18 C |
| 3,771,020 | 11/1973 | Smith | 317/18 C |
| 3,938,006 | 2/1976 | Gadwal et al. | 317/18 C |

Primary Examiner—John W. Caldwell
Assistant Examiner—Daniel Myer
Attorney, Agent, or Firm—Roy, Kiesel, Patterson, Hudson & Abadie

[57] ABSTRACT

An apparatus for determining in the field where breaks or other failures in metal cable occur is provided having a dual electrical pulse generator means attached to a gate assembly wherein one generator means will send an electrical pulse down the cable and back to one of the gates and wherein the other generator sends pulses of same frequency but of a known delay to the same gate. Attached to the gates are means for detecting when pulses from both sources arrive simultaneously at one of the gates.

9 Claims, 2 Drawing Figures

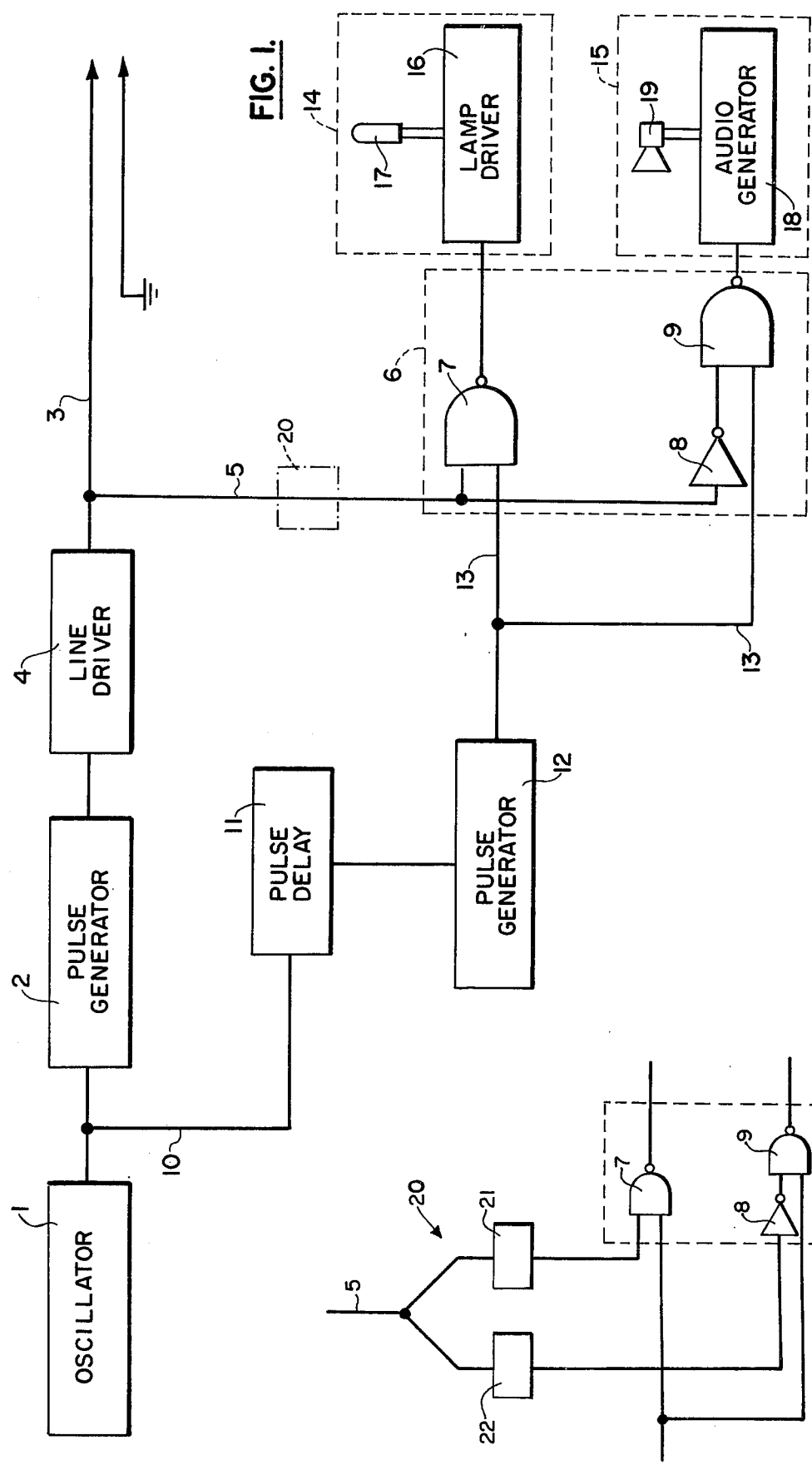

APPARATUS FOR DETECTING LOCATION OF METAL CABLE FAILURE

BACKGROUND OF THE INVENTION

1. Field of the Invention

This invention relates generally to apparatus for determining where cable failures occur, and more particularly to portable apparatus that can be used in the field for determining where cable failures occur.

2. Prior Art.

With the high cost of copper wiring and other metals used in electrical transmission cable various industries, such as, the electrical utilities, telephone, cable television, etc. are faced with high maintenance costs. Part of this problem results in the present inefficient methods and apparatus used to determine in the field where their cable failures occur.

The most common practice today to determine where a cable failure occurs is for the workmen to use an ohmmeter to try to determine areas of non-continuity in the conductivity of the cable. The cable is then cut in between the two points checked and the wire segments then re-checked. Upon determining which segment has the failure, it is removed and replaced. Many times the segment removed might be a hundred feet long although the cable failure might be occurring in less than a foot of the cable. This results in a larger waste of expensive cable.

SUMMARY OF THE INVENTION

It is therefore an object of this invention to provide an apparatus that can effectively determine where a cable failure occurs.

Another object is to provide an apparatus that can be used in the field for effectively determining where a cable failure occurs.

Accordingly, an apparatus for determining where a cable failure occurs is provided having an oscillator connected to an electrical pulse generator means for sending electrical pulses down a cable attached to the generator means, a gate assembly attached to the cable for receiving the returning pulses from the cable, a second electrical pulse generator means attached to a pulse delay means which receives pulses from the ocsillator and regulates when the pulses are transmitted to the second generator means before being sent to the gate assembly and a detection means attached to the gate assembly for determining when pulses from both generator means arrive simultaneously at the gate assembly.

BRIEF DESCRIPTION OF THE DRAWINGS

FIG. 1 is a schematic illustrating one embodiment of the invention.

FIG. 2 is a schematic illustrating a preferred embodiment of an amplifier assembly that may be used in the FIG. 1 embodiment.

PREFERRED EMBODIMENTS OF THE INVENTIONS

Examining the Figure square wave pulses are generated by oscillator 1. Some of these pulses are fed into pulse generator 2 which converts the pulses to narrow pulses. These narrow pulses are then sent down cable 3 which is being inspected, preferably, first through line driver 4 which changes the impedance of the pulse to coincide with that of cable 3. In this manner, a higher energy pulse being reflected back by the break or short in cable 3. The reflected pulse is then passed down line 5 to gate assembly 6.

The actual components of gate assembly 6 can vary depending on the type pulse sent through cable 3 and whether or not it is desired for the apparatus to detect both a short or a gap in the cable. In the preferred embodiment shown in the FIG. 1 gate assembly 6 will comprise nand gate 7 connected in parallel with inverter 8 and second nand gate 9, the latter two being connected in series. In this arrangement, the reflected pulse travels down line 5 and if the pulse is a negative pulse (i.e., cable failure resulting from opening in cable 3) it enters gate 7. On the other hand, if the reflected pulse is a positive pulse (i.e., cable failure resulting from short in cable 3) it enters inverter 8 and then gate 9.

Other pulses from oscillator 1 are passed through line 10 to a pulse delay means 11 which can delay the pulses from being transmitted to the second pulse generator means 12. From pulse delay means 11 the pulses are sent to a second pulse generator 12 which converts the pulses to narrow pulses, preferably of the same size as the pulses from pulse generator 2. The pulses travel through line 13 to same gate as the pulse traveling through line 5 (i.e., either gate 7 or gate 9).

Both gate 7 and gate 9 are designed to allow the pulses through to detection means 14 or 15, respectively, when pulses from line 5 and line 13 arrive simultaneously. In one embodiment as shown in the Figure, detection means 14 could comprise a lamp driver 16 which converts the narrow pulses to pulses sufficiently wide to light up lamp 17. In another embodiment, detection means 15 could comprise an audio generator 18 that drives sound emitting device 19. Quite obviously, detection means 14 and 15 could be identical.

In another preferred feature, as shown in FIG. 2, the pulse being reflected back down cable 3 and in line 5 will enter an amplifier assembly 20. In a particularly preferred embodiment amplifier assembly 20 comprises a negative pulse amplifier 21 connected in parallel with a positive pulse amplifier 22 as illustrated. In this embodiment if the reflected pulse is negative (open cable condition) the pulse will pass through amplifier 21 before being sent to nand gate 7. If the reflected pulse is positive (shorted cable condition) the pulse will pass through amplifier 22 before being sent to inverter 8.

If it is desired to design an apparatus that can detect the location of failures in cable up to 1400 feet, then any oscillator 1 that generated pulses at a frequency around 500 kilowertz could be used. At this frequency, a 10 nanosecond pulse would be preferably developed by pulse generators 2 and 12. Within these limits, pulses would have time to travel down cable 3 and be reflected back and detected without being confused with other pulses. If it is desired to measure longer cable then a lower frequency would need to be generated (e.g., a 100 kilohertz frequency would allow measurement of cable up to three miles long).

In another preferred embodiment, pulse delay means 11 would have pre-calibrated settings depending on the type and diameter cable being tested.

Other modifications and embodiments could be made and are intended to be within the scope of this invention as seen by the following claims.

What I claim is:

1. An apparatus for determining where a cable failure occurs which comprises:
   a. an oscillator;
   b. a pulse generator connected in series with said oscillator and said cable;
   c. a gate assembly connected in series with said pulse generator and said cable to receive pulses which have been sent down said cable by said pulse generator and which have been reflected back toward said pulse generator;
   d. a second pulse generator connected in series to said gate assembly;
   e. a pulse delay means connected in series between said oscillator and said second pulse generator; and
   f. a detection means connected in series with said gate assembly for detecting when said pulses being reflected and said pulses from said second pulse generator arrive simultaneously at said gate assembly.

2. An apparatus according to claim 1 wherein said detection means comprises a lamp driver connected to a lamp, said lamp driver broadening said pulses coming from said assembly a sufficient amount to light said lamp when said pulses arrive at said assembly simultaneously.

3. An apparatus according to claim 1 wherein said detection means comprises an audio generator connected to a sound emitting device said audio generator being of sufficient power to drive said sound emitting device.

4. An apparatus according to claim 1 wherein a line driver is connected in series between said pulse generator and said cable.

5. An apparatus according to claim 1 wherein gate assembly comprises
   a. a first nand gate;
   b. a pulse inverter connected in series before a second nand gate, said first nand gate being connected in parallel with said inverter and second nand gate, said second pulse generator connected separately in series with both of said gates.

6. An apparatus according to claim 5 wherein said detection means comprises a lamp driver connected to a lamp, said lamp driver broadening said pulses coming from said assembly a sufficient amount to light said lamp when said pulses arrive at said assembly simultaneously.

7. An apparatus according to claim 5 wherein said detection means comprises an audio generator connected to a sound emitting device said audio generator being of sufficient power to drive said sound emitting device.

8. An apparatus according to claim 5 wherein a line driver is connected in series between said pulse generator and said cable.

9. An apparatus according to claim 1 wherein an amplifier assembly comprising a negative pulse amplifier and a positive pulse amplifier connected in parallel and which receive and amplify said reflected pulses from said cable before sending said amplifier pulses to said gate assembly.

* * * * *